(12) United States Patent
Lee et al.

(10) Patent No.: US 6,403,424 B1
(45) Date of Patent: Jun. 11, 2002

(54) METHOD FOR FORMING SELF-ALIGNED MASK READ ONLY MEMORY BY DUAL DAMASCENE TRENCHES

(75) Inventors: Chung-Yeh Lee, Hsin Chu; Pei-Ren Jeng; Henry Chung, both of Hsinchu, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/967,955

(22) Filed: Oct. 2, 2001

(51) Int. Cl.[7] .............................................. H01L 21/336
(52) U.S. Cl. ...................... 438/280; 438/723; 438/299; 438/738; 438/633
(58) Field of Search ................................. 438/280, 299, 438/669, 639, 303, 720–723, 738–744, 659, 633, 264

(56) References Cited

U.S. PATENT DOCUMENTS 6,265,319 B1 * 7/2001 Jang .......................... 438/723

* cited by examiner

Primary Examiner—Olik Chaudhuri
Assistant Examiner—Yennhu B. Huynh
(74) Attorney, Agent, or Firm—Rosenberg, Klein & Lee

(57) ABSTRACT

A method for forming a self-aligned mask read only memory by dual damascene trenches is disclosed. In the method, a thickness difference is formed between the gate area and periphery to be formed with a dual damascene trench so as to be formed with a condition of self-alignment of read only memory code. Thus, the manufacturing range in the lithography is enlarged, and an ion implantation process with self-aligned ability complete. Therefore, self-aligned read only memory codes and metal word lines are formed. The defect of disalignment in the read only memory code is resolved and the difficulty in the manufacturing process is reduced.

18 Claims, 9 Drawing Sheets

METHOD FOR FORMING SELF-ALIGNED MASK READ ONLY MEMORY BY DUAL DAMASCENE TRENCHES

FIELD OF THE INVENTION

The present invention relates to a manufacturing process of non volatile read only memory, and especially to a method for forming self-aligned read only memory code implanting area and metal word line by dual damascene trenches.

BACKGROUND OF THE INVENTION

In the mask read only memory, a field effect transistor is used as a memory cell. Memory cells are arranged as an array in a memory. The assembly of each column and row represents a specific memory cell address. The open or close of the memory cell is determined by the values of the gate voltage with a voltage threshold.

The manufacturing process of a general mask read only memory contains the steps of multiple depositions, lithography, and etchings. In the lithography, the pattern on the mask is completely transferred to the photoresistor on the surface of a substrate so that the succeeding etching or ion implantation or other processes can be made conveniently. The completed mask read only memory has a structure of a plurality of polysilicon word lines crossing over the bit lines. The channels of the memory cells are between the areas blow the covering area of the word lines and the bit lines so that in the programming process, the ion implantation is selectively performed to the surface of the channel area to change the ion distribution in the channel area. Thus, voltage threshold is adjusted for storing data.

However, with the increment of the integration in the semiconductor, the design rule becomes small so that the size of element must be reduced. In the programming ion implantation in the channel area, the mask read only memory is easily disalignment in the ion implantation area due to the patternized photoresistor in the lithography process, causing the voltage threshold shift of the element so that the directions of the word lines and bit lines are shifted. Further, the data in memory cell of the read only memory is wrong and peripheral other implantation area is interfered, thereby effecting the operation property of the whole memory.

In the prior art, phase shift mask (PSM) is used to resolve this problem. However, the technology of PSM is hard and is not economical.

SUMMARY OF THE INVENTION

Accordingly, the primary object of the present invention is to provide a method for forming a self-aligned mask read only memory by dual damascene trenches, wherein the manufacturing range in the lithography is enlarged and an ion implantation process with self-aligned ability is complete. Therefore, self-aligned read only memory codes and metal word lines are formed. The defect of disalignment in the read only memory code is resolved and the difficulty in the manufacturing process is reduced.

Another object of the present invention is to provide a method for forming a self-aligned mask read only memory by dual damascene trenches which can be used in the MROM process of below 0.18 μm. The manufacturing process of the present invention is simple and the metal gate and word line can be formed at the same time.

A further object of the present invention is to provide a method for forming a self-aligned mask read only memory by dual damascene trenches, wherein metal word line is used to replace the prior art polysilicon word line to reduce the resistance of the word line, save power and cost.

To achieve the object, the present invention provides a method for forming a self-aligned mask read only memory by dual damascene trenches comprising the steps of: forming a gate oxide layer on a substrate and a defined first polysilicon layer; doping the substrate by using the first polysilicon layer as a mask so as to be formed with a buried bit line; depositing a first oxide layer and removing part of the first oxide layer until the first polysilicon layer is exposed; forming a patternized second polysilicon layer on the substrate to cover part of the first polysilicon layer and part of the first oxide layer; removing the first polysilicon layer and the first oxide layer by using the second polysilicon layer as a mask; depositing a second oxide layer on the substrate, and removing part of the second oxide layer until the second polysilicon layer is exposed; removing the second polysilicon layer and part of the first polysilicon layer so as to be formed with dual damascene trenches; forming a first patternized photo resistor on the substrate to cover part of the first polysilicon layer; using the first patternized photo resistor as a mask to perform ion implantation process; and forming a self-aligned first ion doping area blow the exposed first polysilicon layer; removing the first patternized photo resistor; forming a second patternized photo resistor on the substrate to cover part of the first polysilicon layer; using the second patternized photo resistor as a mask to perform a second ion implantation and forming a self-aligned second ion doping area on the substrate below the first polysilicon layer; removing the second patternized photo resistor; and depositing a metal layer to fully fill the dual damascene trenches on the substrate; filling fully the dual damascene trenches so as to be formed with metal gate and word lines.

The various objects and advantages of the present invention will be more readily understood from the following detailed description when read in conjunction with the appended drawing.

BRIEF DESCRIPTION OF THE DRAWINGS

FIGS. 1A to 9A are elevational views about the manufacturing process of the preferred embodiments of the present invention.

FIGS. 1B to 9B are cross sectional views along lines I—I of FIGS. 1A to 9A.

FIGS. 1C to 9C are cross sectional views along lines II—II of FIGS. 1A to 9A.

DETAILED DESCRIPTION OF THE INVENTION

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

The primary feature of the present invention is about the method for implanting read only memory code and metal word line by self-alignment by forming a dual damascene trench using a dual polysilicon by dual damascene so as to resolve the problem of voltage threshold shift the prior art read only memory code.

Figure 1A:
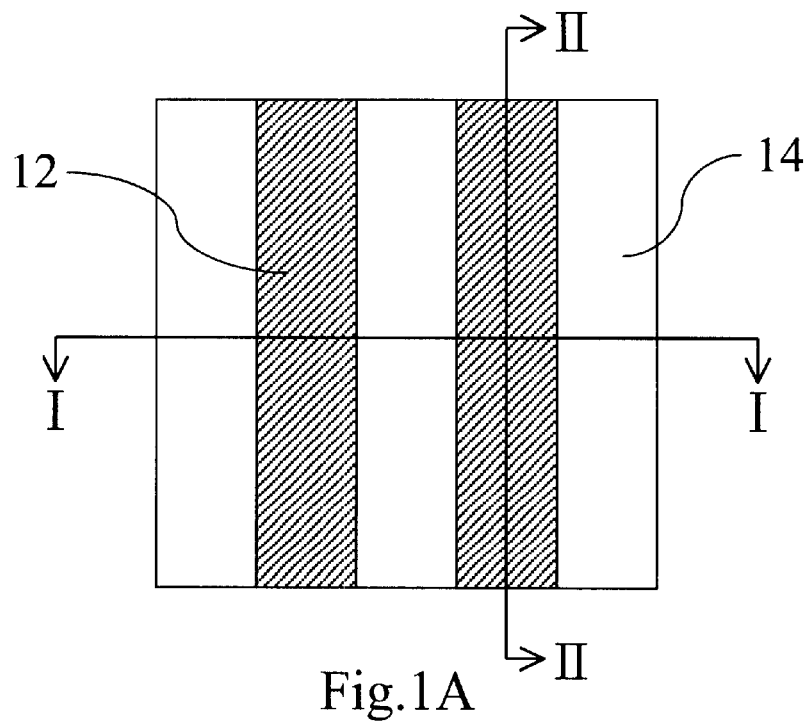
Figure 1B:
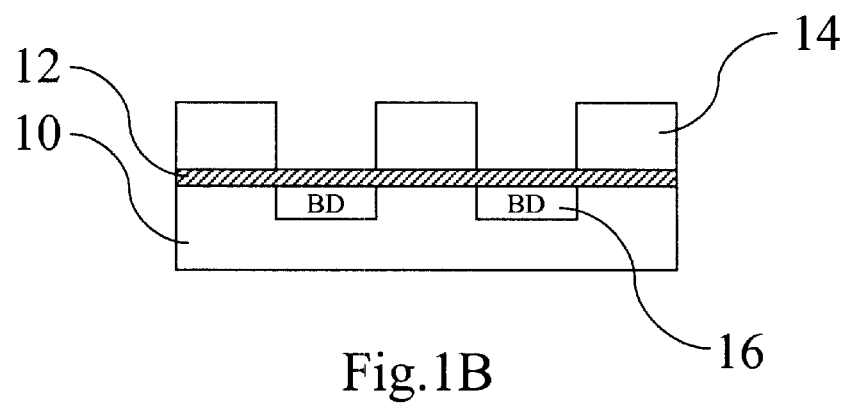
Figure 1C:
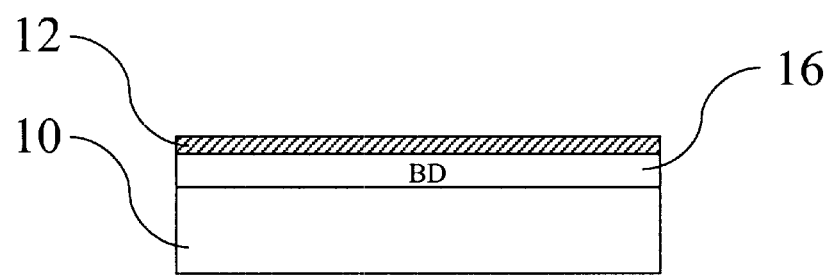

Referring to FIGS. 1A, 1B and 1C, in the present invention, a first polysilicon layer 14 is formed on a gate oxide layer 12 in advance by chemical vapor depositing method. The first polysilicon layer 14 is defined by prior lithography and etching process so as to form a plurality of parallel first polysilicon layers 14. Then the defined first polysilicon layers 14 are used as masks, doping the substrate 10 by ion implantation so that a berry diffusion layer 16 is formed between adjacent first polysilicon layers 14 as a buried bit line.

Figure 2A:
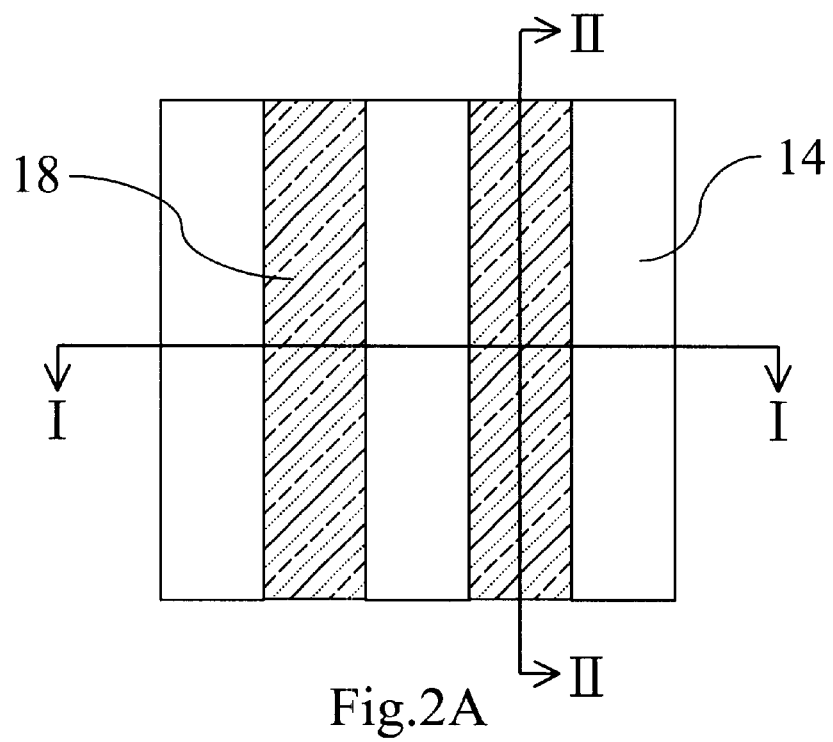
Figure 2B:
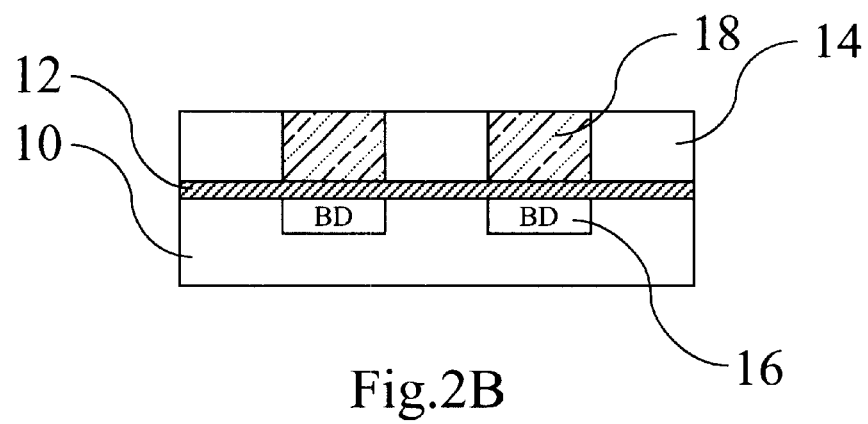
Figure 2C:
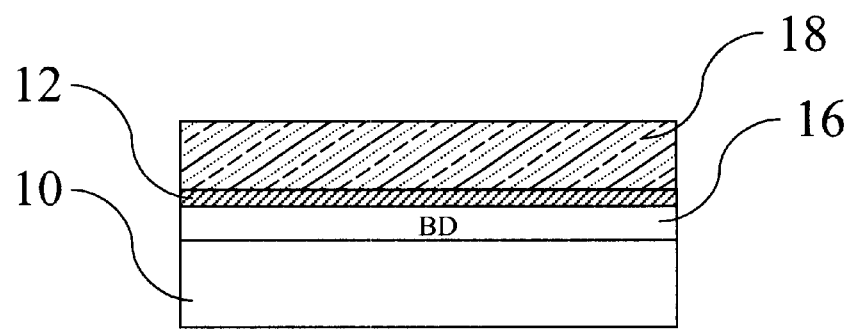

After completing the polysilicon gate of each first polysilicon layer 14, as shown in FIGS. 2A, 2B and 2C, a first oxide layer 18 is deposited on the substrate 10 by high density plasma chemical vapor deposition (HDP-CVD). In general, the oxide layer will fully fill the gaps between first polysilicon layers 14 and chemical mechanical polishing process is used to smooth the surface for removing surplus first oxide layer 18 until the first polysilicon layers 14 are exposed.

Figure 3A:
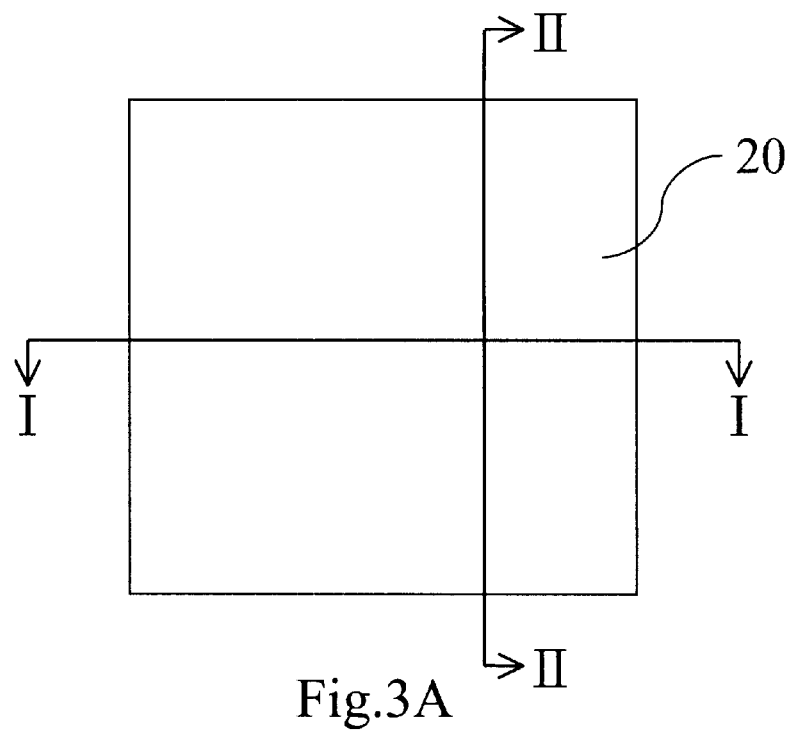
Figure 3B:
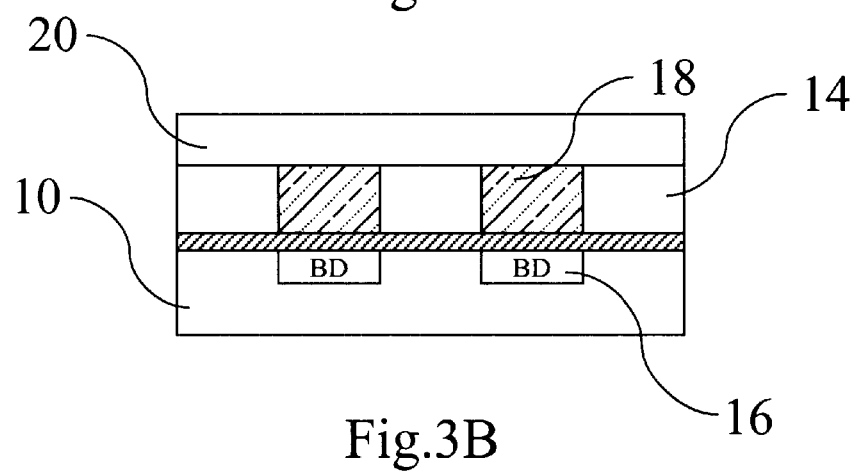
Figure 3C:
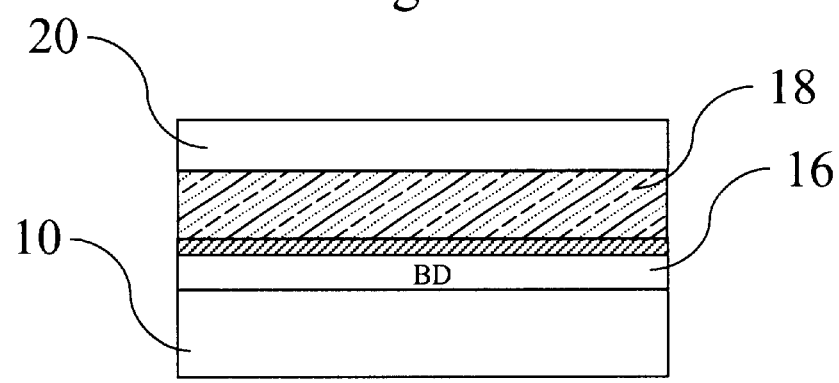
Figure 4A:
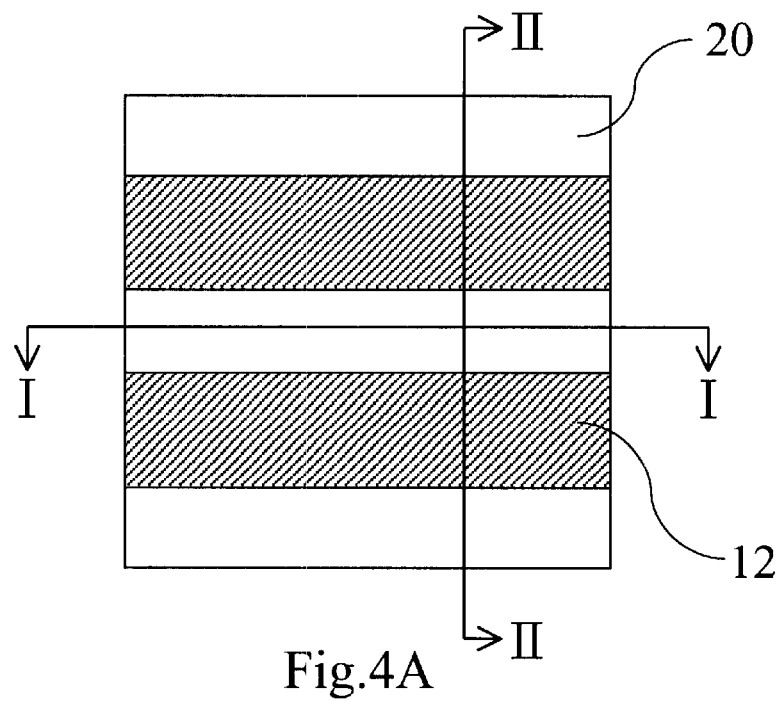
Figure 4B:
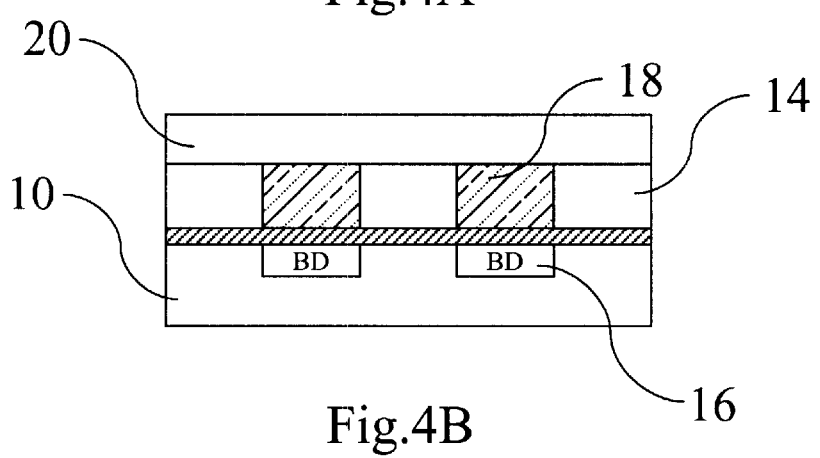
Figure 4C:
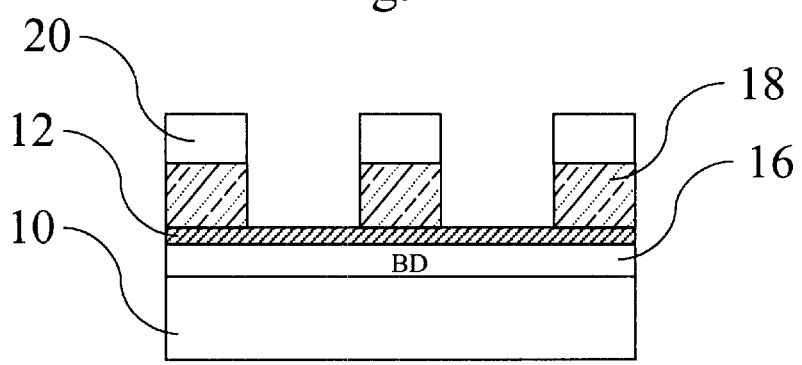

Referring to FIGS. 3A, 3B and 3C, a second polysilicon layer 20 is deposited on the substrate 10 for coating the surfaces of the first polysilicon layers 14 and first oxide layers 18. Then processes of light lithography and etching are used to be formed with a patterned second polysilicon layer 20 so that only part of the first polysilicon layers 14 and part of first oxide layers 18 are coated. Thereby, the position of each word line and position of each transistor are defined, as shown in FIGS. 4A, 4B and 4C. The patternized second polysilicon layer 20 is used as a mask, the exposed first polysilicon layers 14 and first oxide layers 18 are etched until the gate oxide layer 12 are exposed.

Figure 5A:
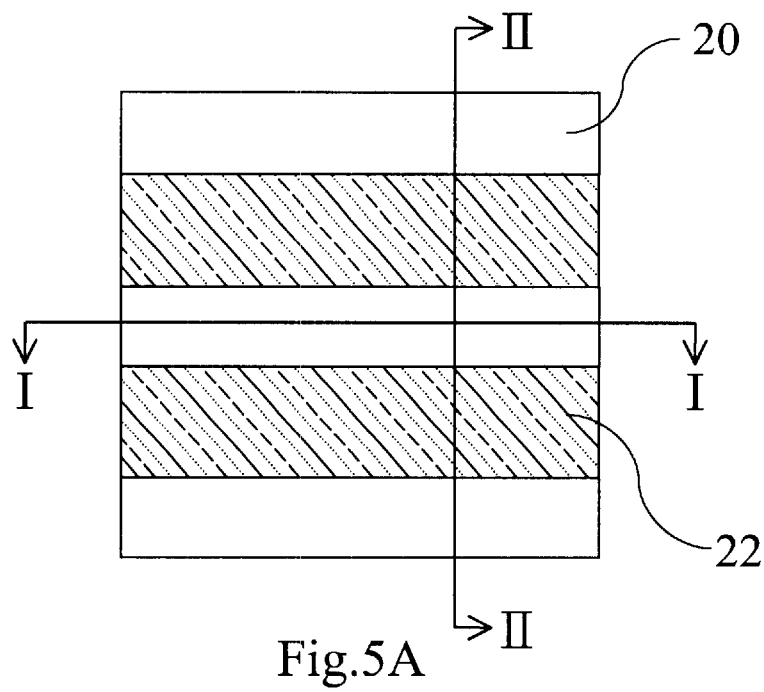
Figure 5B:
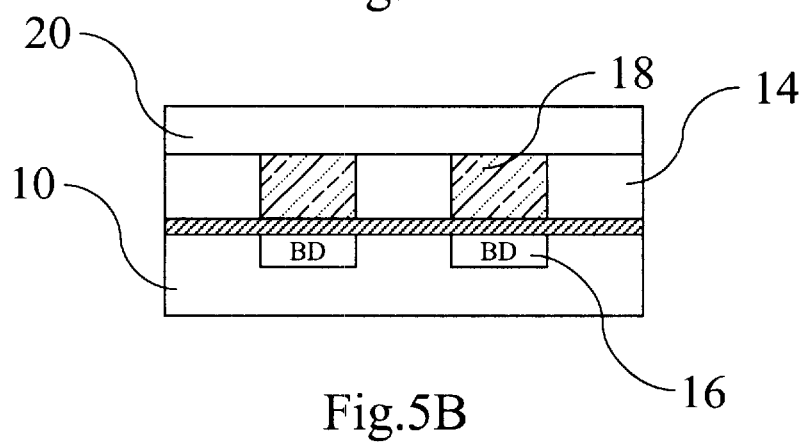
Figure 5C:
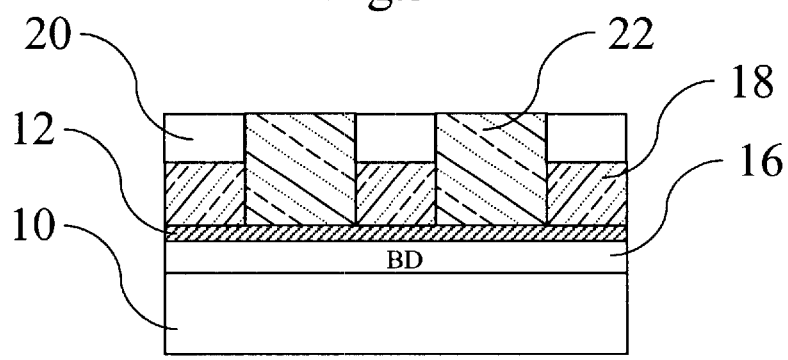

Referring to FIGS. 5A, 5B and 5C, a second oxide layer 22 is deposited on the substrate 10. The second oxide layer 22 is a high density plasma silicon oxide layer by HDP-CVD for fully filling the gaps of the exposed strip-like gate oxide layer 12. Then the surplus second oxide layer 22 is removed by chemical mechanical polishing process to smooth the surface until the second polysilicon layer 20 are exposed.

Figure 6A:
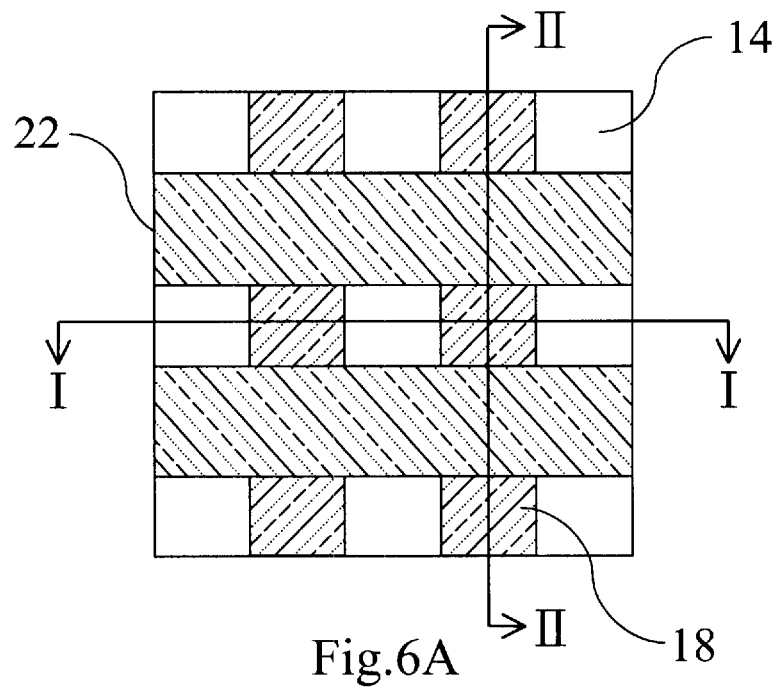
Figure 6B:
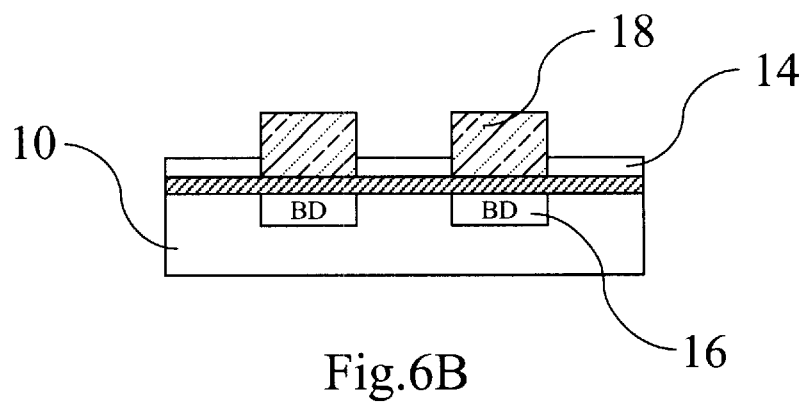
Figure 6C:
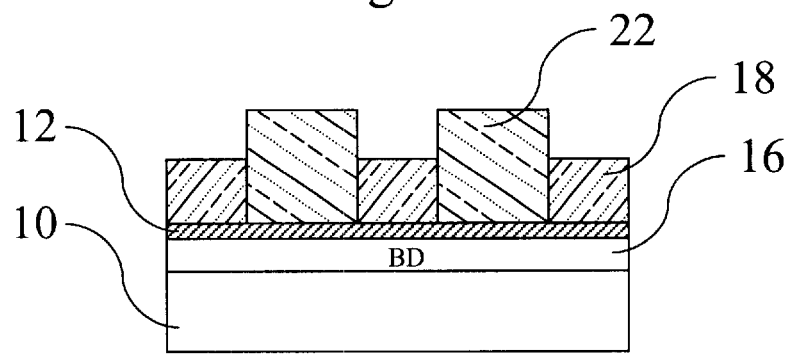

By polysilicon etching, as illustrated in FIGS. 6A, 6B and 6C, the second polysilicon layer 20 and part of the first polysilicon layer 14 are removed so as to be formed with a dual damascene trench to be formed with a stepped difference with the peripheral oxide layer. Therefore, in the succeeding implantation of the read only memory code, the alignment of lithography has a larger allowance tolerance. The first polysilicon layer 14 can be etched completely. The thickness of the surplus first polysilicon layer 14 can be controlled properly so that only a thinner first polysilicon layer 14 is remained for matching the succeeding ion implantation process. In the present invention, a part of first polysilicon layer 14 is used to describe a preferred embodiment of the present invention.

Figure 7A:
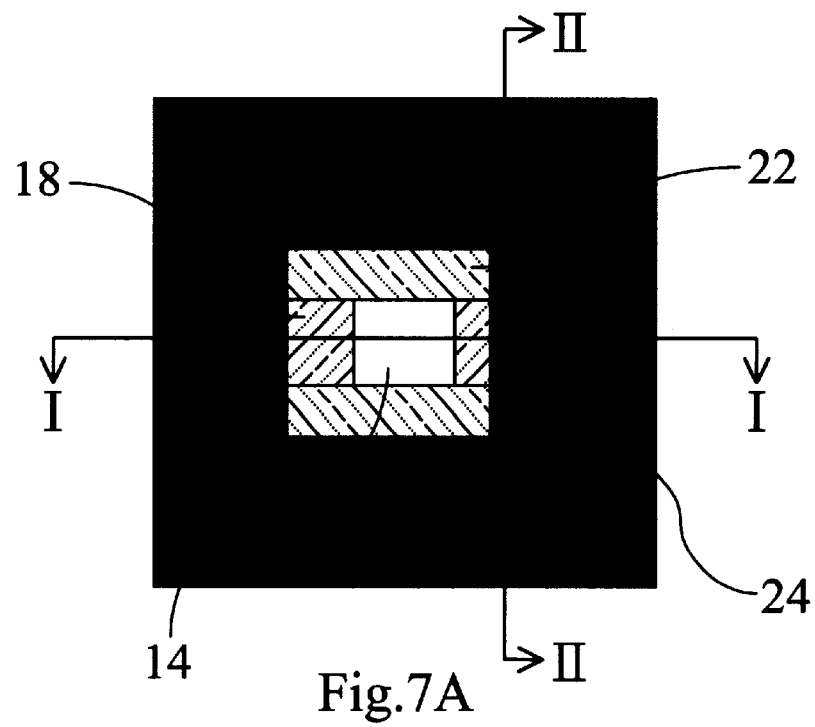
Figure 7B:
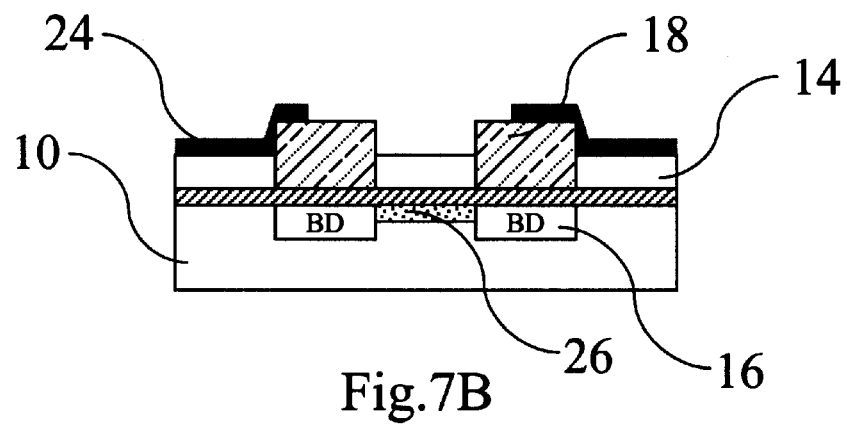
Figure 7C:
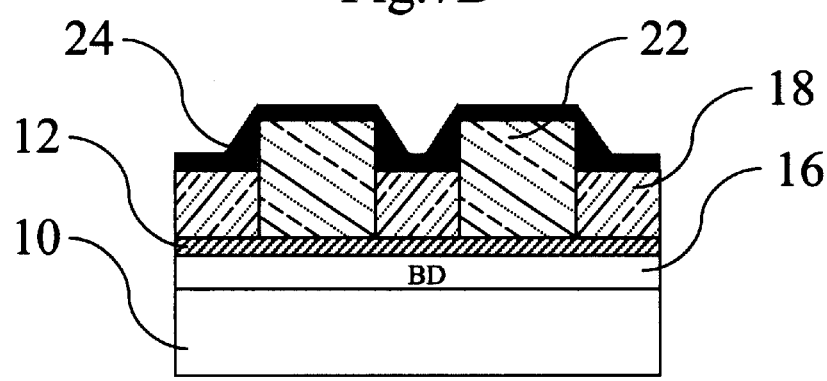

Neat, referring to FIGS. 7A, 7B and 7C, a first patternized photo resistor 24 is in advance formed on the substrate 10 to cover part of the first polysilicon layer 14. The necessary read only memory code is implanted into a transistor by the first patternized photo resistor 24. Then, the first patternized photo resistor 24 is used as a mask to perform the first ion implantation process. A self-aligned first ion doping area 26 is formed on the substrate 10 below the exposed first polysilicon layer 14 for being written with a first read only memory code. Since the process for forming the first ion doping area 26 has the effect of self-alignment, only the substrate 10 below the first polysilicon layer 14 is doped. Therefore, as the first patternized photo resistor 24 is used as mask, a process window with a larger size can be used in the lithography process, not worrying about that the read only memory code is not aligned so as to induce the problem of the voltage threshold shift. After the first read only memory code is doped, then the first patternized photo resistor 24 is removed, and then the rapid anneal process is performed.

Figure 8A:
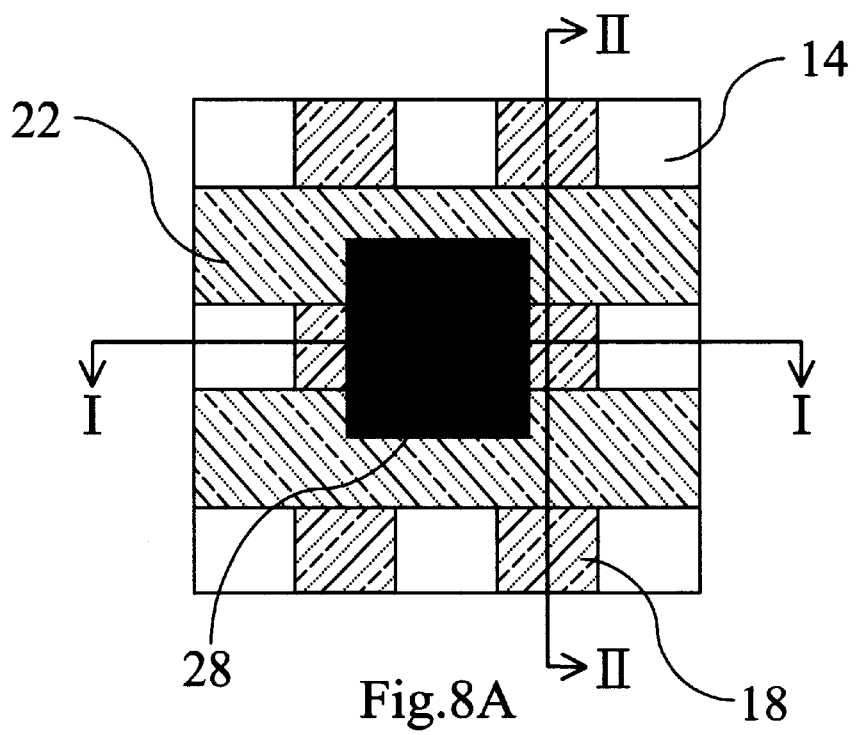
Figure 8B:
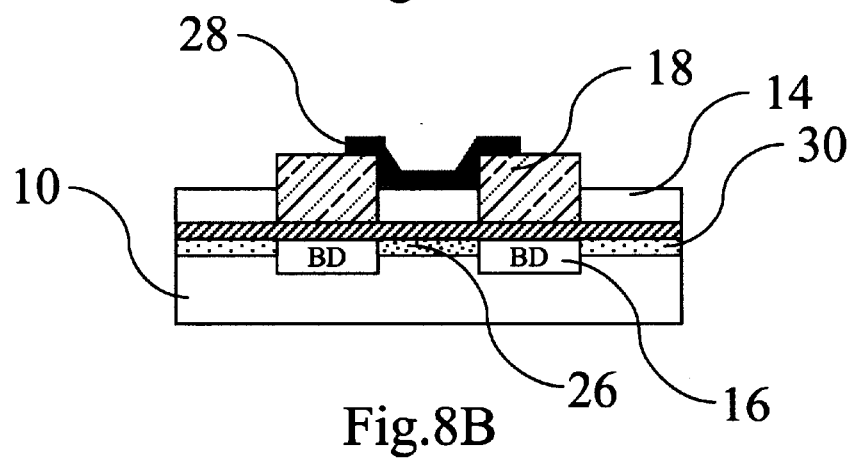
Figure 8C:
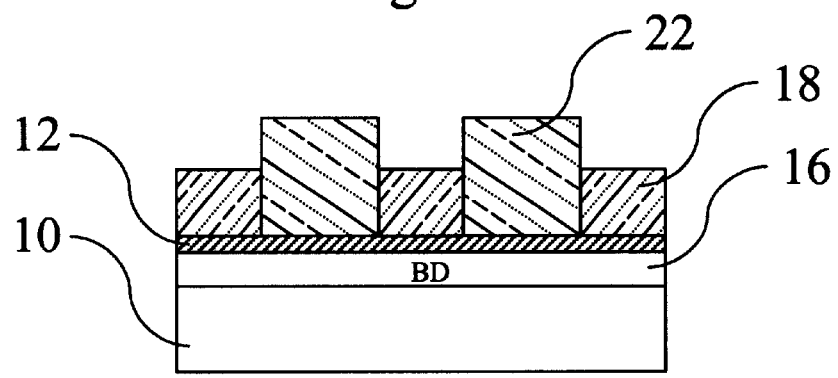

Next, the second ion implantation process is performed, as shown in FIGS. 8A, 8B and 8c. A second patternized photo resistor 28 is formed on the substrate for coating the other part of the first polysilicon layer 14. The necessary read only memory code is implanted by the second patternized photo resistor 28. Then, the second patternized photo resistor 28 is used as a mask for performing the process of second ion implantation. A self-aligned second ion doping area 30 is formed at the substrate 10 below the exposed first polysilicon layer 14 for being written with a second read only memory code. The dose of the second read only memory code is different from that of the first read only memory code in the first ion doping area 26. Thereby, by the difference of the first and second read only memory codes, the transistors have different layered voltage thresholds for adjusting the voltage threshold to write storage data. The self-aligned second ion doping area 30 has the same effect as the first ion doping area 26. Thus, the detail will not be described herein. Then the second patternized photo resistor 28 is removed. Finally, a rapid anneal process is used.

Figures 9A, 9B, 9C:
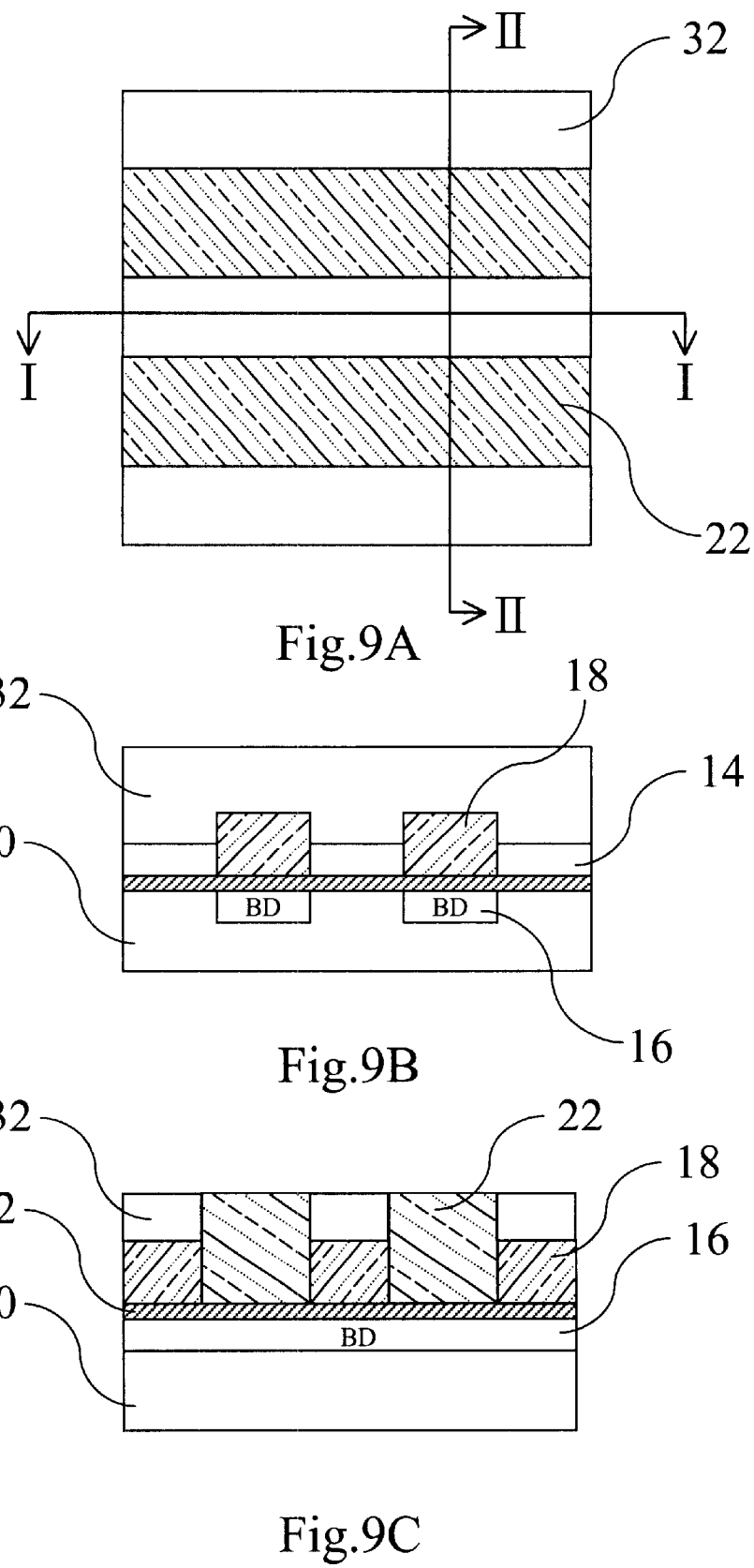

Finally, referring to FIGS. 9A, 9B, and 9C, a metal layer 32 is deposited and coated on the substrate 10 to fully fill the dual damascene trench. The metal layer 32 is electrically connected to the first polysilicon layer 14. Then chemical mechanical polishing process is used to flat the metal layer 32 until the second oxide layer 22 is exposed. Then the dual damascene metal gate and word lines are formed. The metal word line has a preferred material and is made by copper and other metal for reducing the resistance, saving power and speeding the operation.

Therefore, in the present invention, a dual damascene trench structure is installed in the MROM for enhancing the size of the opening of the process window in the lithography process. The problem of the voltage threshold shift due to the difficulty of the controlling in the alignment of the read only memory code is resolved. Thus, self-aligned read only memory code and self-aligned metal word line are formed. Since such characteristics, the method of the present invention can be further used in the MROM process of below 0.18 $\mu$m. Furthermore, the manufacturing process is simplified. Furthermore, in the present invention, metal word line is used to replace the prior art polysilicon word line to reduce the resistance of the word line, save power and cost.

The present invention are thus described, it will be obvious that the same may be varied in many ways. Such variations are not to be regarded as a departure from the spirit and scope of the present invention, and all such modifications as would be obvious.

What is claimed is:

1. A method for forming a self-aligned mask read only memory by dual damascene trenches comprising the steps of:

forming a gate oxide layer on a substrate and a defined first polysilicon layer;

doping the substrate by using the first polysilicon layer as a mask so as to be formed with a buried bit line;

depositing a first oxide layer and removing part of the first oxide layer until the first polysilicon layer is exposed;

forming a patterned second polysilicon layer on the substrate to cover part of the first polysilicon layer and part of the first oxide layer;

removing the first polysilicon layer and the first oxide layer by using the second polysilicon layer as a mask;

depositing a second oxide layer on the substrate, and removing part of the second oxide layer until the second polysilicon layer is exposed;

removing the second polysilicon layer and part of the first polysilicon layer so as to be formed with dual damascene trenches;

forming a first patterned photo resistor on the substrate to cover part of the first polysilicon layer;

using the first patterned photo resistor as a mask to perform ion implantation process so as to form a self-aligned first ion doping area below the exposed first polysilicon layer;

removing the first patterned photo resistor;

forming a second patterned photo resistor on the substrate to cover part of the first polysilicon layer;

using the second patterned photo resistor as a mask to perform a second ion implantation so as to form a self-aligned second ion doping area on the substrate below the first polysilicon layer;

removing the second patterned photo resistor;

depositing a conductive layer to fully fill the dual damascene trenches on the substrate; and removing part of the metal layer until the second oxide layer is exposed.

2. The method as claimed in claim 1, wherein the first oxide layer and second oxide layer are high density plasma oxide layer.

3. The method as claimed in claim 1, wherein in the step of removing the first oxide layer comprises the step of using chemical mechanical polishing process to complete the step.

4. The method as claimed in claim 1, wherein the step of removing the exposed first polysilicon layer and first oxide layer are performed by etching.

5. The method as claimed in claim 1, wherein the step of removing the second oxide layer is performed by chemical mechanical polishing process.

6. The method as claimed in claim 1, wherein the step of removing the second polysilicon layer and part of the first polysilicon layer is performed by etching.

7. The method as claimed in claim 1, wherein the second ion doping area is formed for writing a first read only memory code.

8. The method as claimed in claim 1, wherein the second ion doping area is formed for writing a second read only memory code.

9. The method as claimed in claim 1, wherein the material of the metal layer is selected from the group containing tungsten and copper.

10. A method for forming a self-aligned mask read only memory by dual damascene trenches comprising the steps of:

forming a gate oxide layer on a substrate and a defined first polysilicon, layer;

doping the,substrate by using the first polysilicon layer as a mask so as to be formed with a buried bit line;

depositing a first oxide layer and removing part of the first oxide layer until the first polysilicon layer is exposed;

forming a patterned second polysilicon layer on the substrate to cover part of the first polysilicon layer and part of the first oxide layer;

removing the first polysilicon layer and the first oxide layer by using the second polysilicon layer as a mask;

depositing a second oxide layer on the substrate, and removing part of the second oxide layer until the second polysilicon layer is exposed;

removing the second polysilicon layer and the first polysilicon layer to expose part of the gate oxide layer so as to be formed with dual damascene trenches;

forming a first patterned photo resistor on the substrate to cover part of the gate oxide layer;

using the first patterned photo resistor as a mask to perform ion implantation process so as to form a self-aligned first ion doping area below the exposed first polysilicon layer;

removing the first patterned photo resistor;

forming a second patterned photo resistor on the substrate to cover part of the gate oxide layer;

using the second patterned photo resistor as a mask to perform a second ion implantation and forming a self-aligned second ion doping area on the substrate below the gate oxide layer;

removing the second patterned photo resistor;

depositing a metal layer to fully fill the dual damascene trenches on the substrate; and removing part of the metal layer until the second oxide layer is exposed.

11. The method as claimed in claim 10, wherein the first oxide layer and second oxide layer are high density plasma oxide layer.

12. The method as claimed in claim 10, wherein in the step of removing the first oxide layer comprises the step of using chemical mechanical polishing process to complete the step.

13. The method as claimed in claim 10, wherein the step of removing the exposed first polysilicon layer and first oxide layer are performed by etching.

14. The method as claimed in claim 10, wherein the step of removing the second oxide layer is performed by chemical mechanical polishing process.

15. The method as claimed in claim 10, wherein the step of removing the second polysilicon layer and part of the first polysilicon layer is performed by etching.

16. The method as claimed in claim 10, wherein the second ion doping area is formed for writing a first read only memory code.

17. The method as claimed in claim 10, wherein the second ion doping area is formed for writing a second read only memory code.

18. The method as claimed in claim 10, wherein the material of the metal layer is selected from the group containing tungsten and copper.

* * * * *